United States Patent

Suzuki

(10) Patent No.: US 10,697,212 B2
(45) Date of Patent: Jun. 30, 2020

(54) CONSOLE BOX

(71) Applicant: KOJIMA INDUSTRIES CORPORATION, Toyota-shi, Aichi (JP)

(72) Inventor: Takahiro Suzuki, Toyota (JP)

(73) Assignee: KOJIMA INDUSTRIES CORPORATION, Toyota-Shi, Aichi (JP)

( * ) Notice: Subject to any disclaimer, the term of this patent is extended or adjusted under 35 U.S.C. 154(b) by 8 days.

(21) Appl. No.: 16/278,860

(22) Filed: Feb. 19, 2019

(65) Prior Publication Data

US 2019/0257123 A1    Aug. 22, 2019

(30) Foreign Application Priority Data

Feb. 20, 2018 (JP) ................................ 2018-027787

(51) Int. Cl.
E05B 83/32 (2014.01)
B60R 7/04 (2006.01)
E05C 7/04 (2006.01)

(52) U.S. Cl.
CPC ............... *E05B 83/32* (2013.01); *B60R 7/04* (2013.01); *E05C 7/04* (2013.01); *E05Y 2900/538* (2013.01)

(58) Field of Classification Search
CPC ..................................... E05B 8/32; B60R 7/04
USPC .............................................. 296/24.34, 37.8
See application file for complete search history.

(56) References Cited

U.S. PATENT DOCUMENTS

| 7,407,200 B2 * | 8/2008 | Ichimaru ................. E05C 17/02 292/194 |
| 8,740,265 B2 * | 6/2014 | Gillis ....................... E05B 83/32 292/214 |
| 8,888,147 B2 * | 11/2014 | Blanck ....................... B60R 7/04 292/34 |
| 2008/0035657 A1 * | 2/2008 | Yamashita ................ B60R 7/04 220/826 |
| 2008/0231060 A1 * | 9/2008 | Carabalona ............. E05B 83/32 292/251.5 |
| 2009/0212586 A1 * | 8/2009 | Blanck ....................... B60R 7/04 296/37.8 |
| 2009/0224564 A1 * | 9/2009 | O'Brien ................. B60N 3/102 296/37.8 |
| 2010/0154309 A1 * | 6/2010 | Shibata ..................... B60R 7/06 49/338 |
| 2014/0062103 A1 * | 3/2014 | Gillis ................... E05B 65/0003 292/214 |

FOREIGN PATENT DOCUMENTS

| JP | 04306384 A | * 10/1992 |
| JP | 2009006830 A | 1/2009 |
| JP | 2009143375 A | 7/2009 |

* cited by examiner

*Primary Examiner* — Dennis H Pedder
(74) *Attorney, Agent, or Firm* — Conley Rose, P.C.

(57) ABSTRACT

A console box includes a box body with an opening, a pair of lids hinged to the box body to open and close the opening, and a lock mechanism configured to lock the lids in closed positions for closing the opening. The lock mechanism includes a first operation member configured to unlock the pair of lids separately from each other, and a second operation member configured to unlock the pair lids simultaneously with each other.

8 Claims, 9 Drawing Sheets

CONSOLE BOX

CROSS-REFERENCE TO RELATED APPLICATIONS

This application claims benefit of Japanese patent application number 2018-027787 filed on Feb. 20, 2018 and entitled "Console Box," which is hereby incorporated herein by reference in its entirety for all purposes.

STATEMENT REGARDING FEDERALLY SPONSORED RESEARCH OR DEVELOPMENT

Not applicable.

BACKGROUND

Embodiments of the present disclosure relate to a console box, and more particularly, to a console box including a box body having an opening, two lids each hinged to the box body so that the opening can be opened and closed by the lids, and a lock mechanism that can lock the lids in a closed position with respect to the box body.

Automobiles are often provided with holders for storing and/or holding cans, bottles or other items. For example, a console box is often mounted on the floor of the automobile at a position between the driver's seat and the front passenger seat. The console box typically includes a box body with an opening and one or more lids hinged to the box body to close the opening. The user can store items in a storage space of the box body through the opening.

BRIEF SUMMARY OF THE DISCLOSURE

In one aspect according to the present disclosure, a console box may comprise a box body with an opening, two lids hinged to the box body to open and close the opening, and a lock mechanism configured to lock the lids in closed positions for closing the opening, the lock mechanism comprising: a first operation member operable to unlock the two lids separately from each other, and a second operation member operable to unlock the two lids simultaneously with each other.

In some embodiments, the console box may further comprise a first biasing device and a second biasing device configured to bias the first operation member and the second operation member, respectively, so that the lids are locked separately from each other, wherein a biasing force of the first biasing device is set to be smaller than a biasing force of the second biasing device.

In some embodiments, the first operation member comprises two first operation members; and the first biasing device comprise two biasing members configured to bias the two first operation members to keep the lids in locked positions.

In some embodiments, the first operation member comprises two first operation members each having a handle portion and configured to be pivotable by a force applied to the handle portion for unlocking the corresponding one of the lids, and the second operation member comprises a push portion and is configured to be pushed by a force applied to the push portion.

In some embodiments, the first operation member comprises two first operation members corresponding to the two lids, the first operation members each having an engagement claw, the second operation member has two engagement holes, and the lock mechanism is configured to lock the lids by engagement of the engaging claws of the first operation members with the engaging holes of the second operation member.

In some embodiments, the lock mechanism may be configured such that: when one of the first operation members moves against the first biasing device in a first direction, the engagement claw of the same first operation member disengages from the corresponding engagement hole of the second operation member; and when the second operation member moves against the second biasing device in a second direction that is opposite to the first direction, both engagement claws of the first operation members disengage from the engagement holes of the second operation member.

In another aspect according to the present disclosure, a console box may comprise: a box body with an opening, a first lid and a second lid coupled to the box body and each configured to be movable between an open position for opening a portion of the opening and a closing position for closing the portion of the opening; and a lock device. The lock device may comprise: a first lock member coupled to the first lid; a second lock member coupled to the second lid; and a third lock member coupled to the box body. The first lock member, the second lock member and the third lock member may be configured such that: each of the first lock member, the second lock member and the third lock member is configured to be movable between a lock position and an unlock position; the first lock member engages the third lock member to lock the first lid at the closing position when both of the first lock member and the third lock member are positioned at the lock positions; the second lock member engages the third lock member to lock the second lid at the closing position when both of the second lock member and the third lock member are positioned at the lock positions; both of the first lock member and the second lock member disengage from the third lock member when the third lock member moves from the lock position to the unlock position; the first lock member disengages from the third lock member when the first lock member moves from the lock position to the unlock position; and the second lock member disengages from the third lock member when the second lock member moves from the lock position to the unlock position.

In some embodiments, the lock device may further comprise a first biasing device, a second biasing device and a third biasing device configured to respectively bias the first lock member, the second lock member and the third lock member toward the lock positions; and the biasing direction of each of the first and second biasing devices is opposite to the biasing direction of the third biasing device.

BRIEF DESCRIPTION OF THE DRAWINGS

For a detailed description of various exemplary embodiments, reference will now be made to the accompanying drawings in which.

DETAILED DESCRIPTION

As previously described, automobiles typically have a console box including a box body with an opening and one or more lids hinged to the box body to close the opening. For example, JP 2009-006830 A discloses a console box that includes two lids located on the driver side and the front passenger side, respectively. The console box is configured such that the lids can be unlocked separately from each other. Therefore, to open both lids the user requires two unlocking actions, one for each lid.

Figure 12:
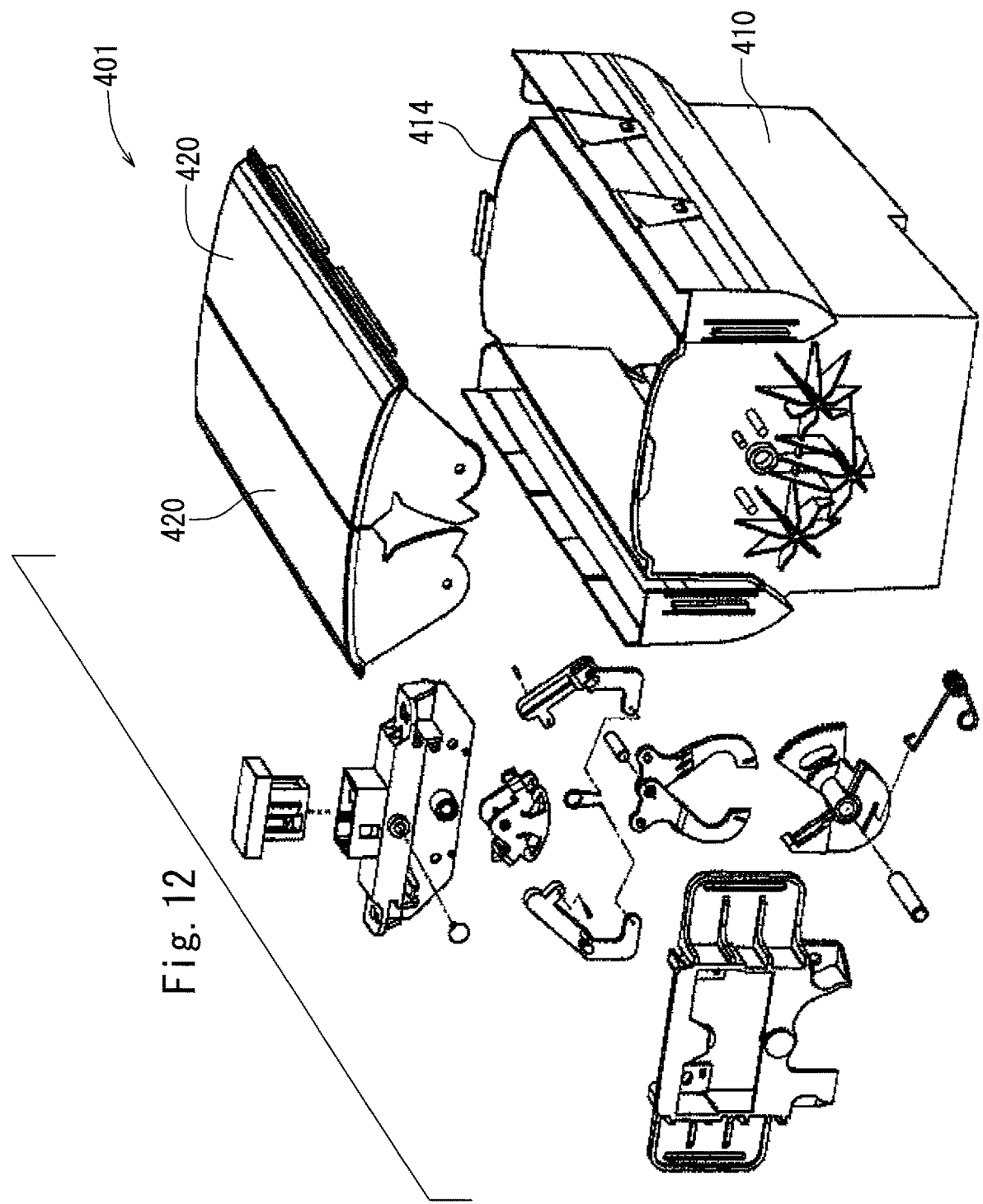
FIG. 12 is an exploded perspective view of a conventional console box.

As another example, JP 2009-143375 A discloses a console box 401 as shown in FIG. 12 that includes two lids 420 located on the driver side and the front passenger side, respectively. The two lids 420 are mechanically coupled such that the user requires the unlocking action at only one time for unlocking both lids. That is, the two lids can be unlocked simultaneously. However, even when it is desired to open only one lid 420, both lids 420 have to be opened. Therefore, the console box of this publication is still not convenient. Thus, there is thus a need in the art for a console box capable of unlocking two lids not only separately but also simultaneously. Accordingly embodiments described herein are directed to console boxes configured to allow unlocking of two lids independently and simultaneously.

Embodiments will be described below with reference to the drawings. In the following, upward, downward, front, rear, left and right directions of a console box 1 correspond to directions that are indicated in the drawings and may be taken when the console box 1 is mounted to an automobile (not shown).

Figure 1:
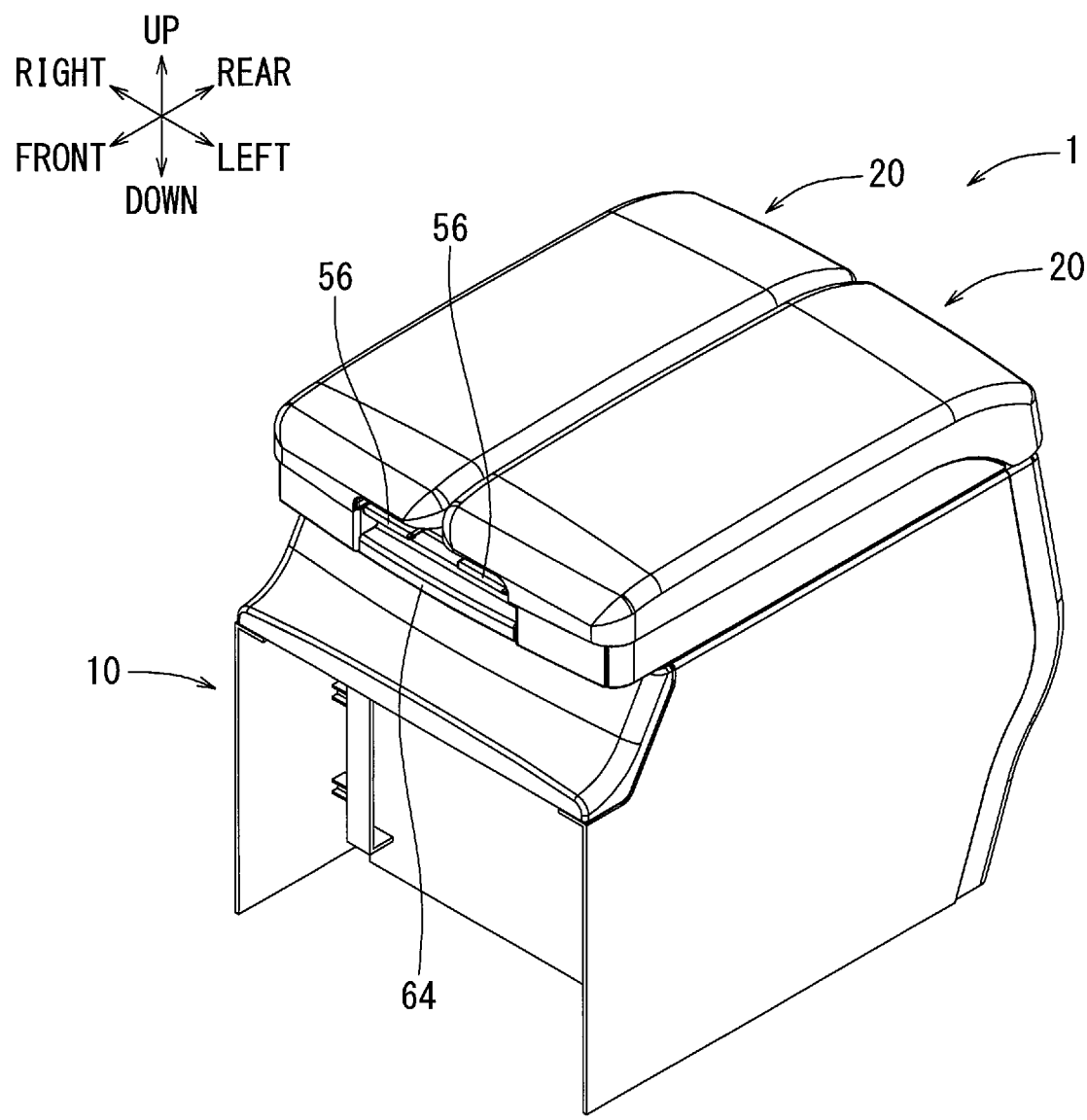
FIG. 1 is a perspective view of a console box according to an embodiment.
Figure 6:
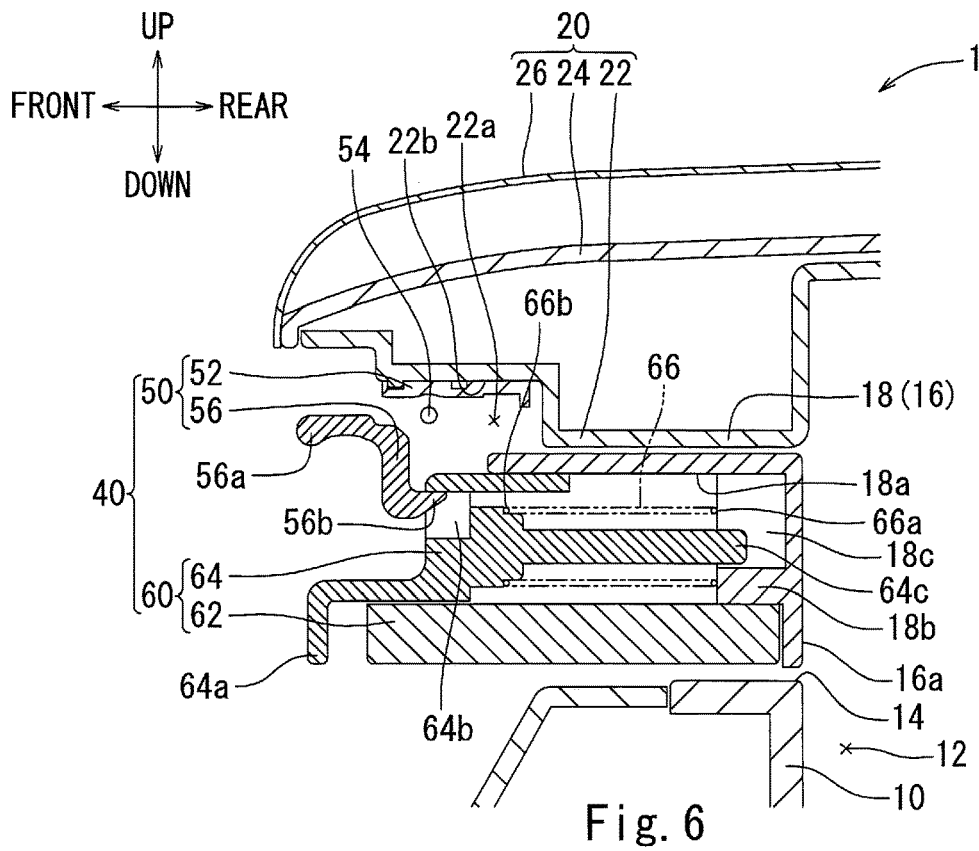
FIG. 6 is a vertical cross-sectional view of the front part of the console box of FIG. 1.

Referring to FIG. 1, the console box 1 may generally include a box body 10, a pair of left and right lids 20, and a lock mechanism 40 (FIG. 6).

Figure 2:
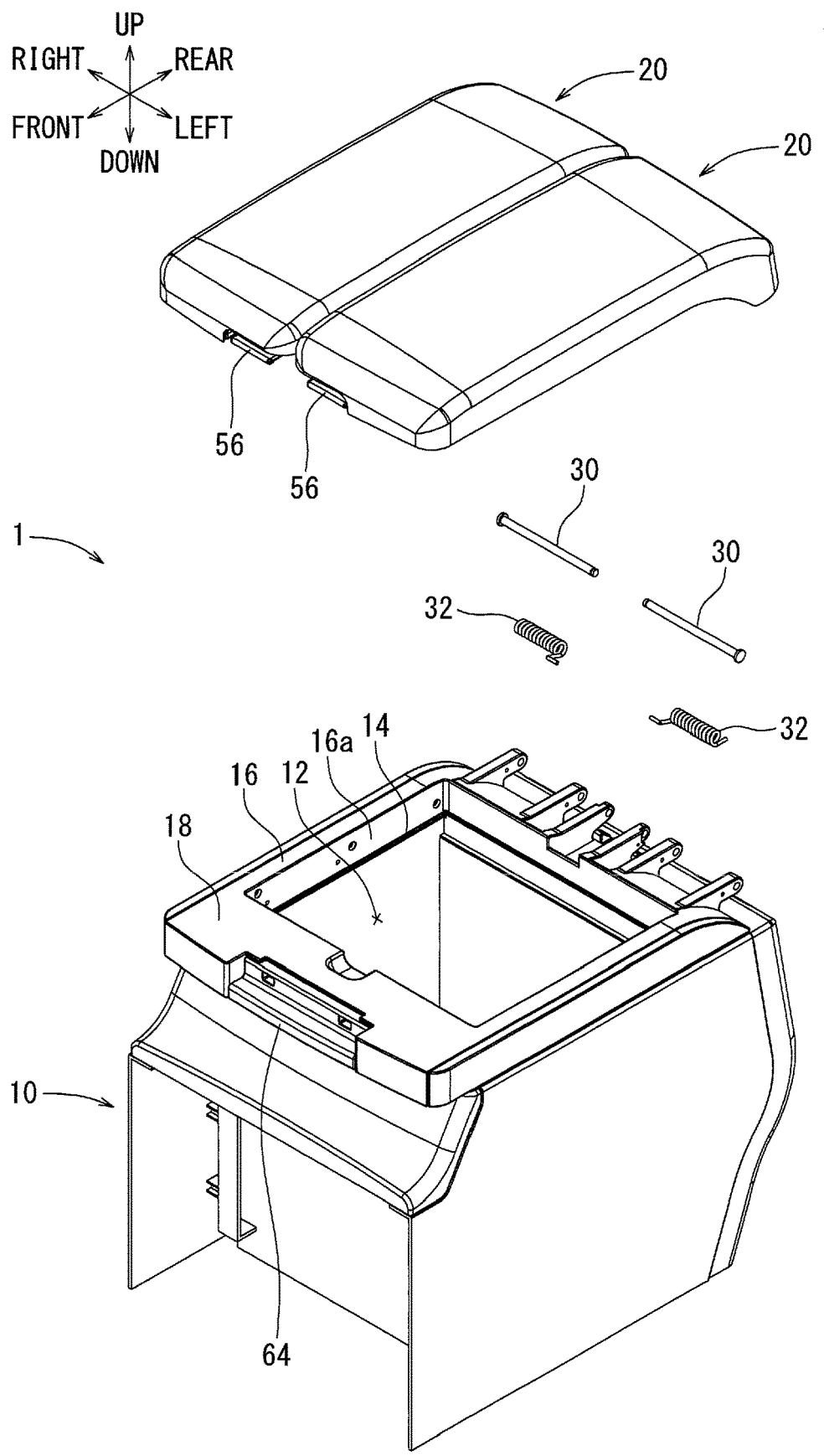
FIG. 2 is an exploded perspective view of the console box shown in FIG. 1.

Referring to FIG. 2, the box body 10 has a container space 12 for storing items (not shown). The container space 12 has, on the upper side, an opening 14 through which the items can be put into and pulled out of the container space 12. This allows the items to be stored in the container space 12 through the opening 14.

A frame 16 with an opening 16a may be attached to the upper end of the peripheral wall of the box body 10 defining the container space 12 and the opening 14. The opening 16a of the frame 16 is aligned with the opening 14 of the box body 10 as shown in FIG. 6. The opening 16a may be the same in size and shape as those of the opening 14. Therefore, the items can be stored into the container space 12 without being obstructed by the attached frame 16.

As shown in FIG. 6, the frame 16 includes a front side portion 18 provided with a spring holding portion 18b on which one end 66a of a compression spring 66 of a second lock 60, which will be described later, can be hooked. The spring holding portion 18b may have a U-shaped groove 18c into which a guide pin 64c of the second lock 60 can be inserted.

Figure 4:
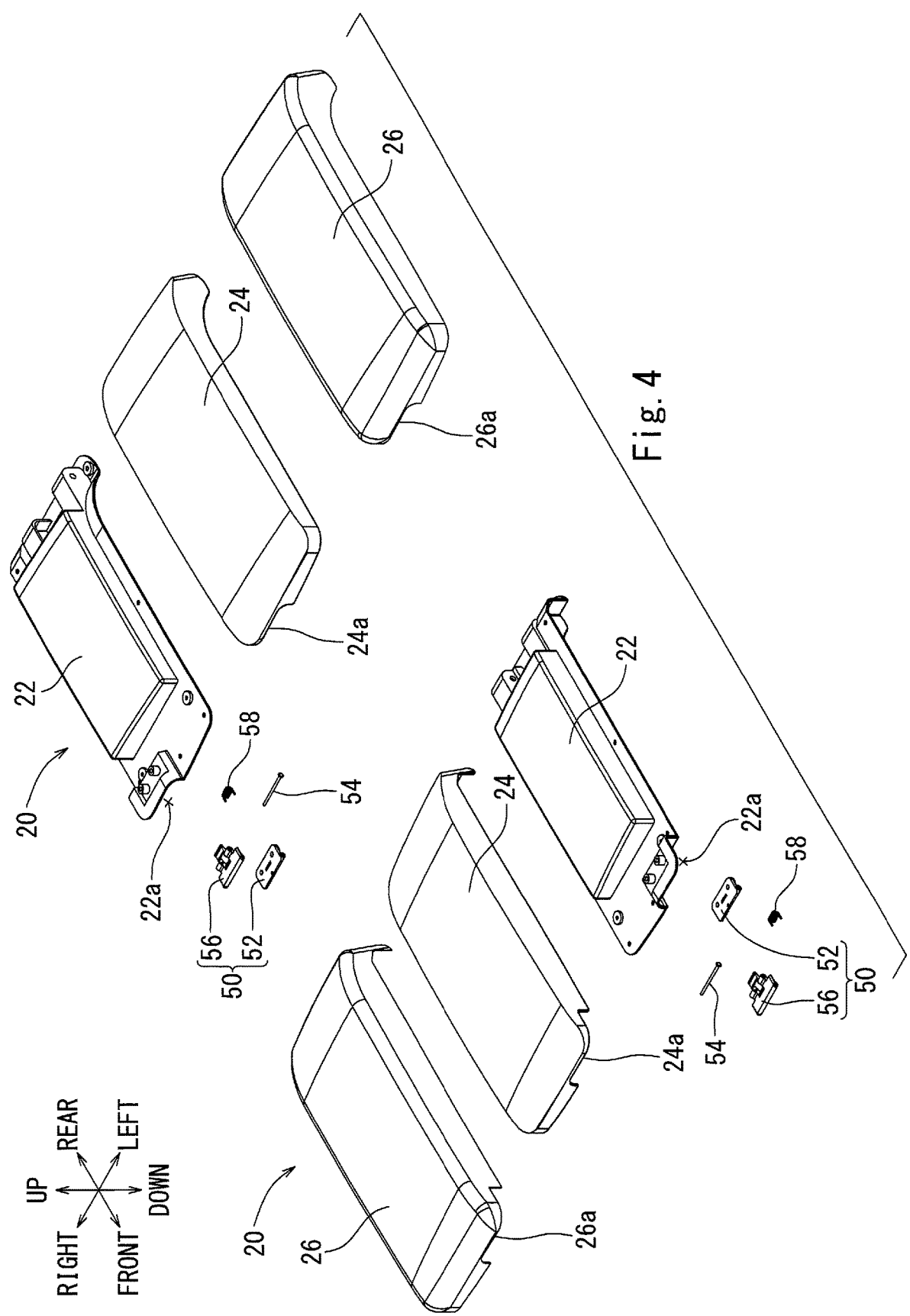
FIG. 4 is an exploded perspective view of left and right lids of the console box shown in FIG. 2.
Figure 5:
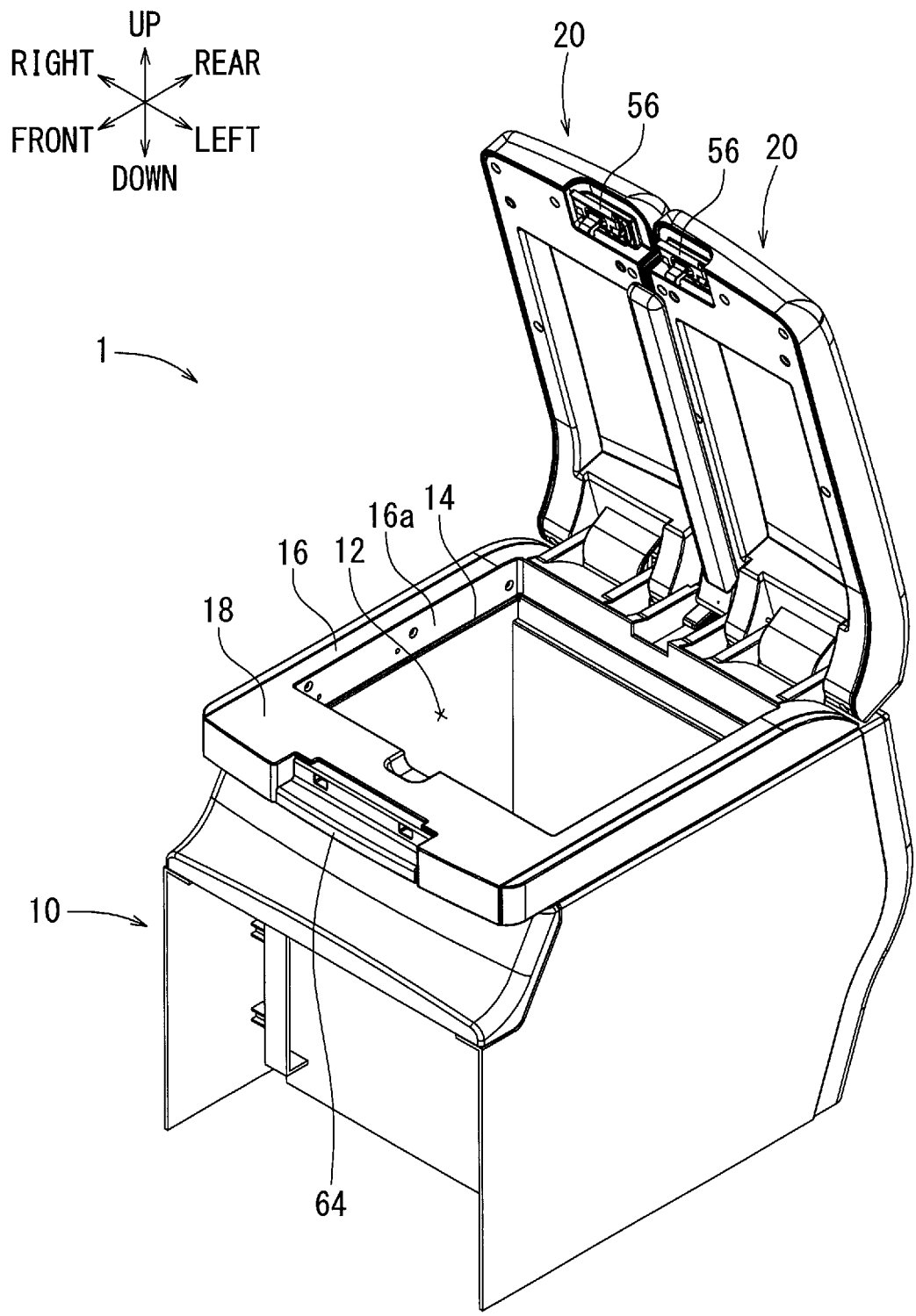
FIG. 5 is a perspective view of the console box of FIG. 1 with the left and right lids opened.

As can be seen in FIGS. 1, 2, 4 and 5, in this embodiment, the two lids 20 are the same, and thus, only the left lid 20 will be described below with the understanding the right lid 20 is the same. Referring to FIG. 4, The left lid 20 includes an inner member 22, an outer member 24 welded to the upper side of the inner member 22, and a skin member 26 covering the surface of the outer member 24 (FIGS. 2 and 4).

The inner member 22 has, in the front right corner portion thereof, a recess 22a that is recessed inward (upward in FIG. 4). The outer member 24 has, in the front right corner portion thereof, a notch 24a aligned with the recess 22a of the inner member 22. The front right corner portion of the skin member 26 has a notch 26a aligned with the recess 22a of the inner member 22 and the notch 24a of the outer member 24.

As shown in FIGS. 4 and 6, the lock mechanism 40 includes two first locks 50 and a second lock 60.

Referring to FIG. 4, each first lock 50 includes a base 52 attached to a concave surface 22b of the recess 22a of the inner member 22 of the lid 20 and a first operation member 56 pivotally attached to the base 52 via a hinge pin 54.

As shown in FIG. 6, the first operation member 56 is a manually pivotable element including a handle portion 56a that can be lifted by a finger(s) of a user for pivoting the first operation member 56. In addition, the first operation member 56 has an engagement claw 56b that can be urged in such a direction that the engagement claw 56b moves into a corresponding one of engagement holes 64b of a second operation member 64 of the second lock 60, which will be described later, by an urging device such as a torsion spring 58 (FIG. 4) to lock the lid 20.

Figure 3:
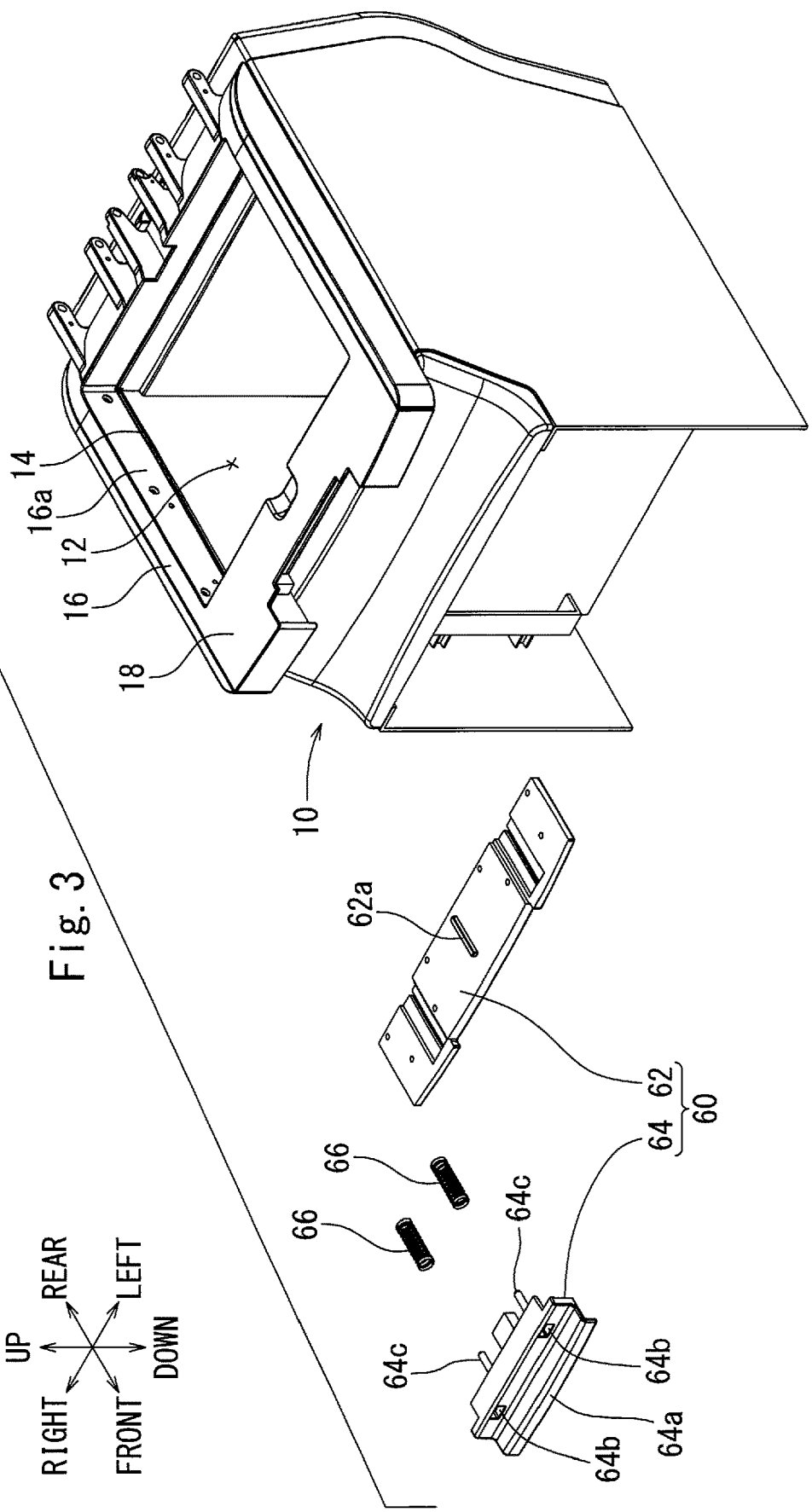
FIG. 3 is an exploded perspective view of a box body of the console box shown in FIG. 2.

Referring to FIGS. 3 and 6, the second lock 60 includes a base 62 attached to the lower side of the front side portion 18 of the frame 16 of the box body 10, and a second operation member 64 attached to the base 62 so as to be slidable in the front and rear directions along a guide rib 62a formed on the base 62. As shown in FIG. 6, the second operation member 64 is a manually pushable element including a push portion 64a that can be pushed by a finger(s) of a user to slide the second operation member 64. The second operation member 64 is urged by an urging device such as left and right compression springs 66 in such a direction that the engagement claw 56b of the first operation member 56 of each first lock 50 enters the corresponding engagement hole 64b of the second operation member 64 to lock the lid 20.

Each compression spring 66 may be fitted on corresponding one of guide pins 64c extending from the second operation member 64, and opposite ends 66a and 66b of the compression spring 66 are hooked on the spring holding portion 18b of the front side portion 18 of the frame 16 and on the base of the guide pin 64c of the second operation member 64, respectively. The biasing force (urging force) of the torsion spring 58 is set to be smaller than the biasing force (urging force) of the compression springs 66.

As shown in FIG. 2, the left and right lids 20 are attached to the rear portion of the upper end of the peripheral wall of the box body 10 via hinge pins 30 so that the opening 14 is opened and closed as the lids 20 pivot in the front and rear directions. The lids 20 are each urged by a corresponding torsion spring 32 in the opening direction. The box body 10 of the console box 1 may be mounted on the floor of the automobile at a position between a driver's seat and a front passenger seat (neither is shown).

Each lid 20 of the console box 1 can be switched between the closed position (FIG. 1) and the opened position (FIG. 5) by pivoting each lid 20 about the corresponding hinge pin 30. As a result, the opening 14 of the box body 10 can be closed and opened. When the lids 20 are in the closed position, the engagement claws 56b of the left and right first operation members 56 can be engaged with the engagement holes 64b of the second operation member 64, as shown in FIG. 6. The lids 20 can thus be locked against the box body 10.

As described above, each of the lids 20 is urged by the corresponding torsion spring 32 in the opening direction. When the lock mechanism 40 is operated to unlock the closed lids 20, each of the lids 20 automatically returns to the opened position by the biasing force of the corresponding torsion spring 32.

Figure 7:
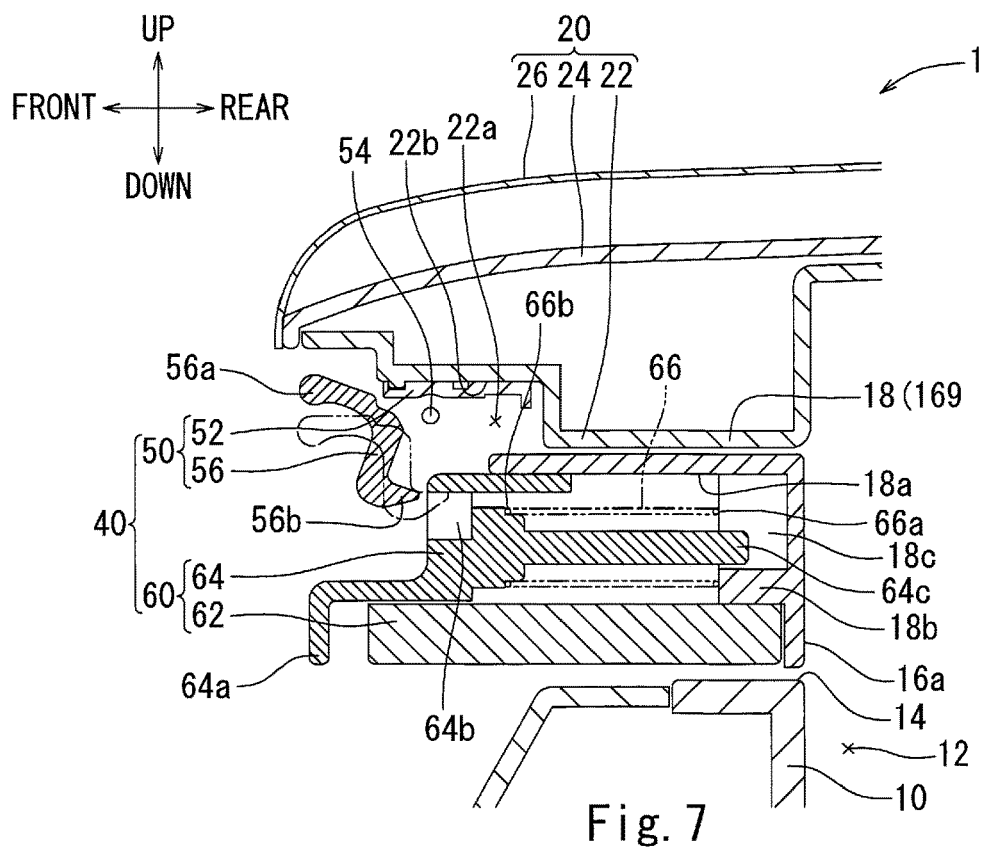
FIG. 7 is a vertical cross-sectional view of the console box similar to FIG. 6 but illustrating the operation state of a first operation member.
Figure 8:
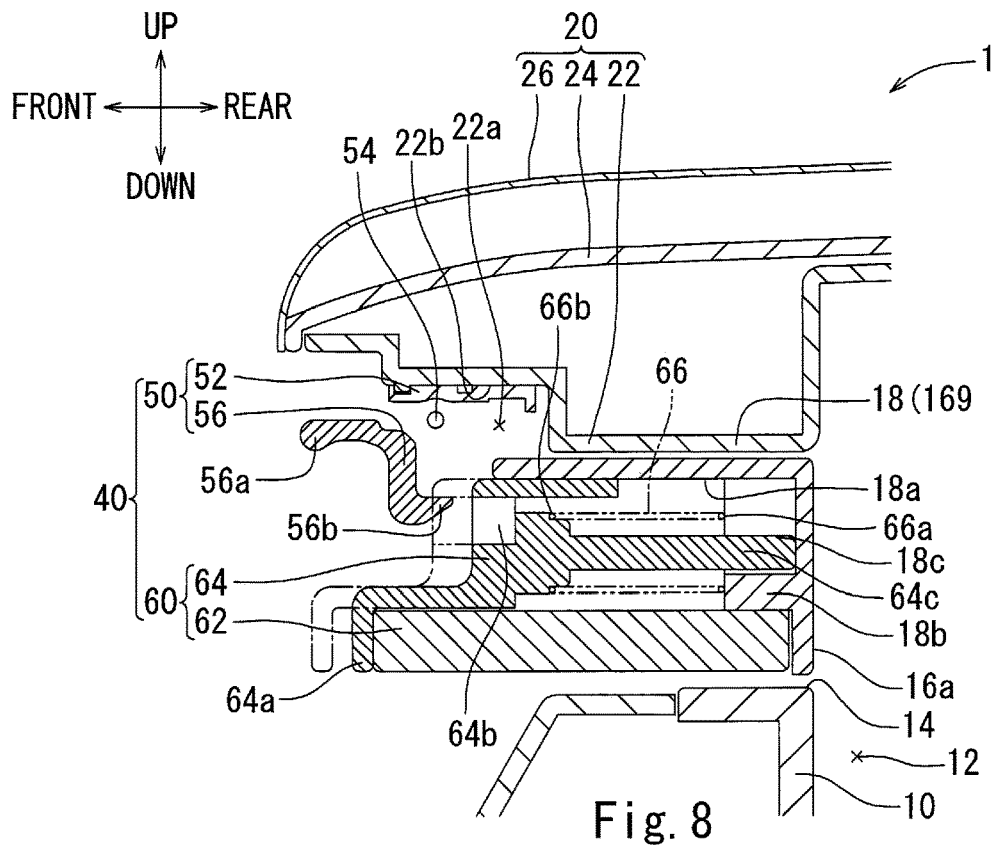
FIG. 8 a vertical cross-sectional view of the console box similar to FIG. 6 but illustrating the operation state of a second operation member.

Referring to FIGS. 6 to 8, operation of the lock mechanism 40 of the console box 1 will now be described. The lock mechanism 40 allows two different unlocking modes for the lids 20: one for unlocking of each lid 20 individually (the first mode) and the other for unlocking of the two lids 20 simultaneously (the second mode).

The first mode for unlocking the left and right lids 20 will be described. To open the left lid 20 that is locked to the box body 10, the user may lift the handle portion 56a of the first operation member 56 for the left lid 20 as shown in FIG. 7. The first operation member 56 then pivots against the biasing force of the torsion spring 58 for the left lid 20, causing the engagement claw 56b of the first operation member 56 for the left lid 20 to disengage from the corresponding engagement hole 64b of the second operation member 64. As a result, the lock mechanism 40 can be operated to unlock only the left lid 20, allowing the left lid 20 to transition to the opened position.

If the left lid 20 thus opened is moved back toward the closed position, the engagement claw 56b of the first operation member 56 may first contact the peripheral edge of the engagement hole 64b of the second operation member 64. As the left lid 20 is further moved back to the closed position, the engagement claw 56b of the first operation member 56 may push the second operation member 64 rearward against the biasing force of the torsion spring 58, so that the engaging claw 56b can pass over the peripheral edge of the engagement hole 64b to enter the engaging hole 64b. In this way, the left lid 20 can be locked in the closed position with respect to the box body 10 as shown in FIG. 6.

The right lid 20 can likewise be switched to the opened position and back to the closed position. In this way, the left and right lids 20 can be separately unlocked.

The second mode for unlocking the left and right lids 20 will now be described. To open the lids 20 that have been locked against the box body 10, the user may push the push portion 64a of the second operation member 64 as shown in FIG. 8. The second operation member 64 then slides backward against the biasing forces of the left and right compression springs 66, thereby causing the engaging claws 56b of the first operation members 56 for the two lids 20 to simultaneously disengage from the engagement holes 64b of the second operation member 64.

As a result, the lock mechanism 40 unlocks both left and right lids 20 simultaneously, allowing both lids 20 to switch to the opened position. That is, the left and right lids 20 can be opened by a single action, i.e. the pushing operation of the second operation member 64. In this way, the left and right lids 20 can be unlocked simultaneously.

The left and right lids 20 thus opened can be switched back to the closed position in the same manner as described above in connection with the first unlocking mode.

The embodiment described above may have the following advantages:

The lock mechanism 40 includes two first operation members 56 for unlocking the left lid 20 and right lid 20 separately from each other, and the second operation member 64 for unlocking the left and right lids 20 simultaneously with each other. Therefore, the left and right lids 20 can be unlocked not only separately but also simultaneously. As a result, both lids 20 do not necessarily have to be opened if it is desired to open only one of the lids 20, as is the case of the known art.

Each of the first operation members 56 is urged by the torsion spring 58 in such a direction that the engagement claw 56b of each first operation member 56 engages with the corresponding hole 64b of the second operation member 64 of the second lock 60 to lock the lid 20. The second operation member 64 is urged by the left and right compression springs 66 in such a direction that the engagement claws 56b of the first operation members 56 of the first locks 50 engage with the corresponding engagement holes 64b of the second operation member 64 to lock the lids 20. The biasing force of the torsion spring 58 is smaller than the biasing force of the compression springs 66. This differential in the biasing forces, when one of the lids 20 is being closed, may prevent the first operation member 56 for the closing lid 20 from pushing the second operation member 64 to inadvertently open the other lid 20 that is in the closed position.

Each of the first operation members 56 has the handle portion 56a for the manual pivotal operation, while the second operation member 64 has the push portion 64a for the manual pushing operation. Since the first operation members 56 are operated in a different manner from the second operation member 64, the user can therefore feel, without need of visual determination, which operation is being performed between the individual unlocking operation and the simultaneous unlocking operation. This can prevent inadvertent unlocking of both lids 20 when it is desirable to open only one of the lids 20 and vice versa.

Each of the first operation members 56 includes the engagement claw 56b. The second operation member 64 includes the engagement hole 64b. The lock mechanism 40 can lock the closed lids 20 through engagement of the engagement claws 56b of the first operation members 56 with the engagement holes 64b of the second operation member 64. Therefore, the lock mechanism 40 is simple in construction.

The above embodiment may be modified in various ways.

In the above embodiment, the left and right lids 20 are attached to the box body 10 via the hinge pins 30 so that the lids 20 can be opened and closed in the front-rear direction. That is, the axes of the hinge pins 30 are oriented left to right. In an alternative embodiment, the left and right lids 20 may be attached to the box body 10 via the hinge pins 30 so that the opening 14 can be opened and closed in the left and right directions. That is, the axes of the hinge pins 30 are oriented front to rear.

Further, in the above embodiment, the first operation members 56 are configured to be pivoted for the unlocking operation, and the second operation member 64 is configured to be pushed for the unlocking operation. However, the first and second operation members 56 and 64 may be configured to be operated in different manners from those in the above embodiment.

Figure 9:
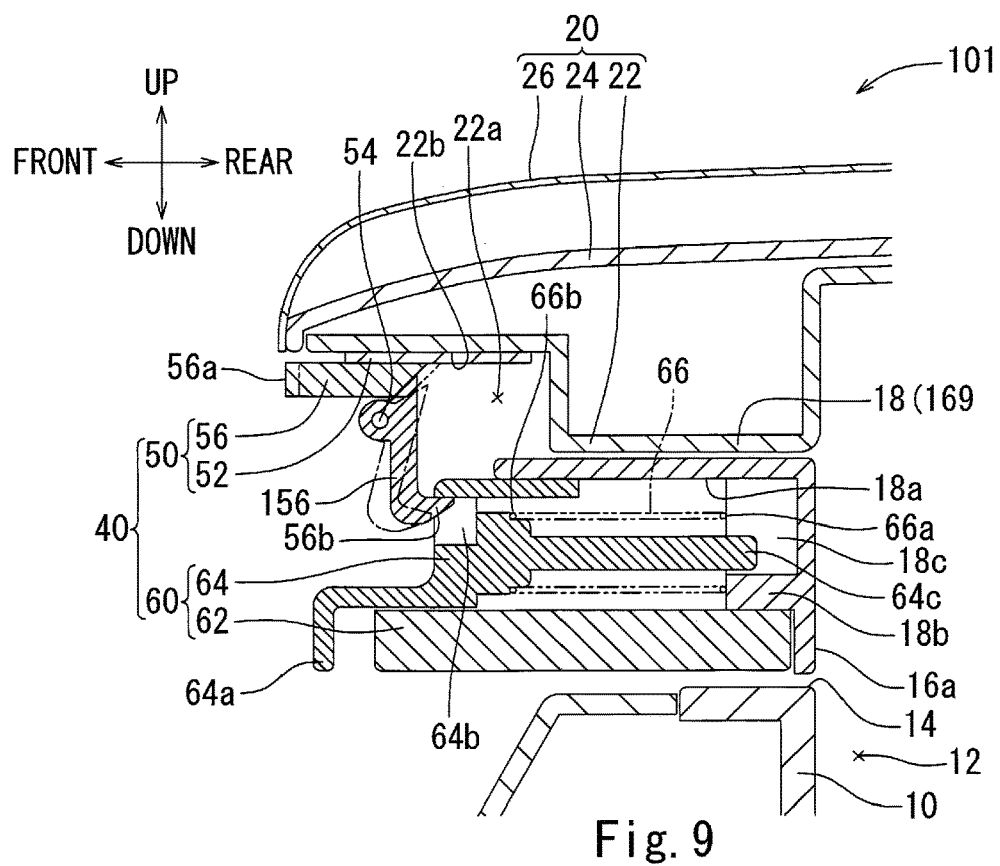
FIG. 9 is a vertical cross-sectional view of a console box according to another embodiment.

For example, FIG. 9 shows a console box 101 according to another embodiment, wherein the first operation members 56 are configured to be pushed for the unlocking operation, while the second operation member 64 is configured to be pushed for the unlocking operation as in the above embodiment shown in FIG. 6. In this embodiment, the engaging claw 56b may be formed on a pivotable member 156 that can pivot by the pushing operation of the first operation member 56. Rearwardly pushing the first operation member may cause the pivotable member 156 to pivot to disengage the engaging claw 56b from the corresponding engagement hole 64b of the second operation member 64 so that the corresponding lid 20 can be unlocked.

Figure 10:
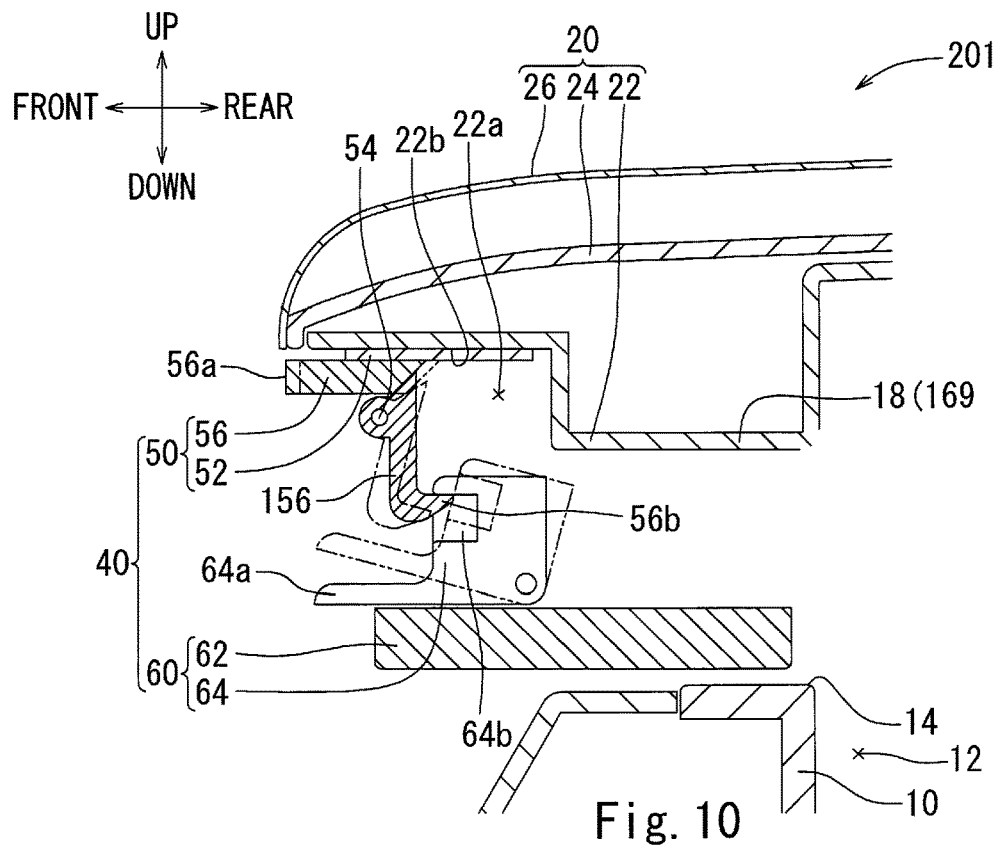
FIG. 10 is a vertical cross-sectional view of a console box according to a further embodiment.

FIG. 10 shows a console box 201 according to a further embodiment, wherein the first operation members 56 are configured to be pushed for the unlocking operation as in the embodiment shown in FIG. 9, while the second operation member 64 is configured to be pivoted for the unlocking operation. In this embodiment, the second operation member 64 is pivotably attached to the base 62. When the user lift the handle portion 64a of the second operation member 64, the second operation member 64 rotates to allow the engagement claw 56b of the pivotable member 156 to disengage from the engagement hole 64b so that the corresponding lid 20 is unlocked.

Figure 11:
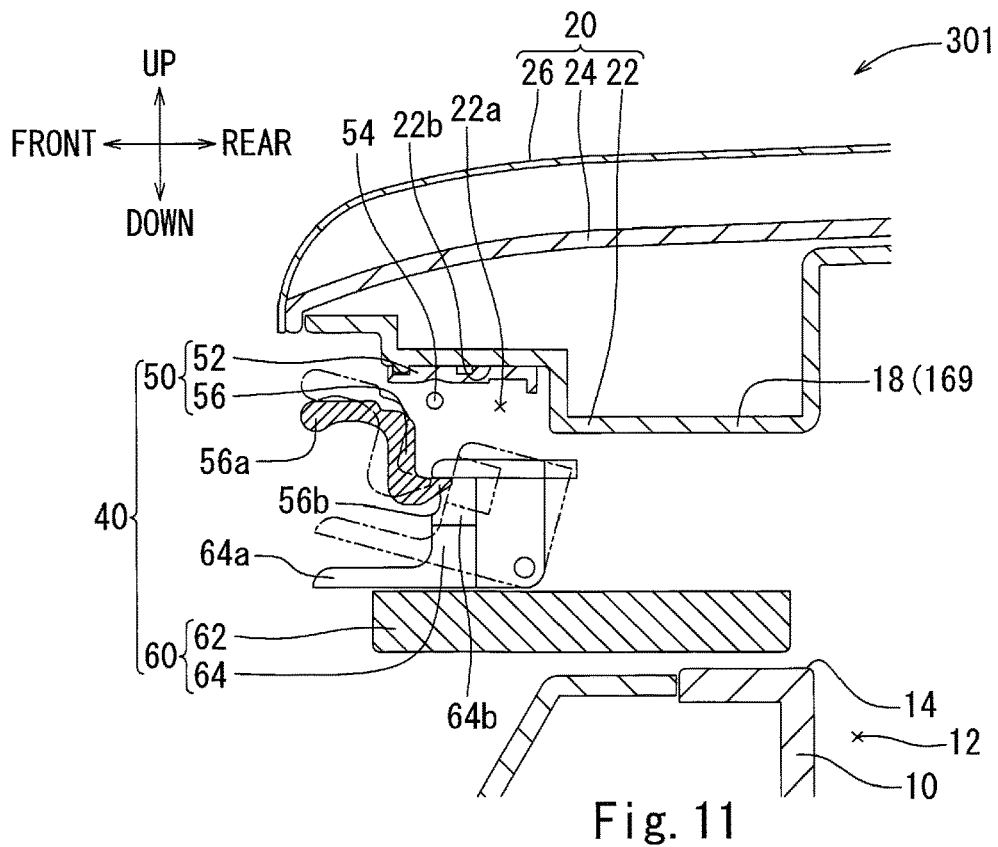
FIG. 11 is a vertical cross-sectional view of a console box according to yet a further embodiment.

FIG. 11 shows a console box 301 according to yet another embodiment, wherein the first operation members 56 are configured to be pivoted for the unlocking operation as in the embodiment shown in FIGS. 1 to 8, while the second operation member 64 is configured to be pivoted for the unlocking operation as in the embodiments shown in FIG. 10.

The above embodiments have been described in connection with the box body 10 of the console box 1 that may be mounted on the floor of an automobile at a position between the driver's seat and the front passenger seat. However, the box body 10 of the console box 1 may be mounted at any position of the floor of the automobile.

In some embodiments, cold air may be generated within the container space 12 of the box body 10. That is, the console box 1 may be configured as a refrigerator. In this case, when putting in or taking out items (e.g. juice cans), the driver needs to open and close only the right lid 20. Likewise, the front passenger only needs to open and close the left lid 20. It is therefore possible to restrict the cold air escaping from the container space 12 as the items are put into or taken out of the console box.

While various embodiments of the present invention have been shown and described, it should be understood that other modifications, substitutions and alternatives are apparent to one of ordinary skill in the art. Such modifications, substitutions and alternatives can be made without departing from the spirit and scope of the invention, which should be determined from the appended claims.

What is claimed is:
1. A console box, comprising:
a box body with an opening;
two lids hinged to the box body to open and close the opening, wherein each lid has an open position and a closed position; and
a lock mechanism configured to lock the lids in the closed positions for closing the opening, the lock mechanism comprising:
a first operation member configured to unlock the two lids separately from each other, and
a second operation member configured to unlock the two lids simultaneously with each other.

2. The console box of claim 1, further comprising:
a first biasing device and a second biasing device configured to bias the first operation member and the second operation member, respectively, so that the lids are locked separately from each other, wherein a first biasing force of the first biasing device is less than a second biasing force of the second biasing device.

3. The console box of claim 2, wherein:
the first operation member comprises two first operation members; and
the first biasing device comprise two biasing members configured to bias the two first operation members to maintain the lids in locked positions.

4. The console box of claim 1, wherein:
the first operation member comprises two first operation members, wherein each first operation member has a handle portion and is configured to be pivotable by a force applied to the handle portion for unlocking the corresponding one of the lids; and
the second operation member comprises a push portion and is configured to be pushed by a force applied to the push portion.

5. The console box according to claim 1, wherein:
the first operation member comprise two first operation members corresponding to the two lids, the first operation members each having an engagement claw;
the second operation member has two engagement holes; and
the lock mechanism is configured to lock the lids by engagement of the engaging claws of the first operation members with the engaging holes of the second operation member.

6. The console box of claim 5, wherein the lock mechanism is configured such that:
when one of the first operation members moves against the first biasing device in a first direction, the engagement claw of the same first operation member disengages from the corresponding engagement hole of the second operation member; and
when the second operation member moves against the second biasing device in a second direction that is opposite to the first direction, both engagement claws of the first operation members disengage from the engagement holes of the second operation member.

7. A console box, comprising:
a box body with an opening;
a first lid and a second lid, wherein each lid is coupled to the box body and is configured to be movable between an open position for opening a portion of the opening and a closing position for closing the portion of the opening; and
a lock device comprising:
a first lock member coupled to the first lid;
a second lock member coupled to the second lid; and
a third lock member coupled to the box body, wherein:
the first lock member, the second lock member, and the third lock member are configured such that:
each of the first lock member, the second lock member and the third lock member is configured to be movable between a lock position and an unlock position;
the first lock member engages the third lock member to lock the first lid at the closing position when both of the first lock member and the third lock member are positioned at the lock positions;

the second lock member engages the third lock member to lock the second lid at the closing position when both of the second lock member and the third lock member are positioned at the lock positions;

both of the first lock member and the second lock member disengage from the third lock member when the third lock member moves from the lock position to the unlock position;

the first lock member disengages from the third lock member when the first lock member moves from the lock position to the unlock position; and the second lock member disengages from the third lock member when the second lock member moves from the lock position to the unlock position.

8. The console box of claim 7, wherein:

the lock device further comprises a first biasing device, a second biasing device and a third biasing device configured to respectively bias the first lock member, the second lock member and the third lock member toward the lock positions; and the biasing direction of each of the first and second biasing devices is opposite to the biasing direction of the third biasing device.

* * * * *